United States Patent
Aoki et al.

(10) Patent No.: US 8,331,101 B2
(45) Date of Patent: Dec. 11, 2012

(54) CHIP COMPONENT MOUNTED WIRING BOARD

(75) Inventors: Toshiaki Aoki, Nagano (JP); Masayoshi Ebe, Nagano (JP); Kiyotaka Shimada, Nagano (JP)

(73) Assignee: Shinko Electronic Industries Co., Ltd., Nagano-shi (JP)

( * ) Notice: Subject to any disclaimer, the term of this patent is extended or adjusted under 35 U.S.C. 154(b) by 426 days.

(21) Appl. No.: 12/693,530

(22) Filed: Jan. 26, 2010

(65) Prior Publication Data

US 2010/0214751 A1   Aug. 26, 2010

(30) Foreign Application Priority Data

Feb. 24, 2009   (JP) ................................ 2009-040176

(51) Int. Cl.
*H05K 1/18* (2006.01)
(52) U.S. Cl. ...................................................... 361/763
(58) Field of Classification Search .................. 361/763, 361/704, 720, 719, 761, 764, 767, 782, 793
See application file for complete search history.

(56) References Cited

U.S. PATENT DOCUMENTS

| 6,884,939 B2 * | 4/2005 | Dishongh et al. ............. 174/534 |
| 7,342,803 B2 * | 3/2008 | Inagaki et al. ................ 361/763 |
| 2004/0214418 A1 * | 10/2004 | Noda et al. ..................... 438/597 |
| 2009/0237200 A1 * | 9/2009 | Yoneda .......................... 338/307 |

FOREIGN PATENT DOCUMENTS

| JP | 2000-77257 | 3/2000 |
| JP | 2007-134398 A1 | 5/2007 |

* cited by examiner

*Primary Examiner* — Jeremy Norris
*Assistant Examiner* — Tremesha S Willis
(74) *Attorney, Agent, or Firm* — Kratz, Quintos & Hanson, LLP

(57) ABSTRACT

A wiring board to be used with being mounted on a packaging board includes a chip component surface-mounted on a surface facing the packaging board. The chip component includes terminal electrodes at both end portions of the component body thereof. Each of the terminal electrodes is provided in a form in which a plated film (Sn) formed on the surface of the terminal electrode is separated into two portions, one portion being on the wiring board side, and another portion being on the packaging board side. In one aspect, each of the terminal electrodes of the chip component is separated into a portion on the wiring board side and a portion on the packaging board side, and the plated film (Sn) is formed on a surface of each of the separated portions of each of the terminal electrodes.

5 Claims, 9 Drawing Sheets

CHIP COMPONENT MOUNTED WIRING BOARD

CROSS-REFERENCE TO RELATED APPLICATIONS

This application is based on and claims priority of Japanese Patent Application No. 2009-040176 filed on Feb. 24, 2009, the entire contents of which are incorporated herein by reference.

BACKGROUND OF THE INVENTION (a) Field of the Invention

The present invention relates to a wiring board to be used with being mounted on a packaging board such as an interposer or another wiring board. More specifically, the invention relates to a chip component mounted wiring board including a passive device (chip component) such as a chip-shaped capacitor or inductor surface-mounted on the surface facing the packaging board.

The aforementioned chip component mounted wiring board is also referred to as a "semiconductor package" or simply as a "package" in the description below for the sake of convenience, because it has the role as a package for mounting an electronic component such as a semiconductor element on the surface opposite to the side facing the packaging board.

(b) Description of the Related Art

While smaller and thinner semiconductor devices with higher performance (higher functionality) have increasingly been developed, POP (package-on-package) bonding is in demand in order to reduce the mounting area in the case where a semiconductor device is formed by mounting a semiconductor element or the like on a wiring board (semiconductor package). In the POP bonding, the packages each including the semiconductor element or the like mounted thereon are stacked in a vertical direction (height direction).

With such a demand, still finer and higher-density wirings are in demand also in semiconductor packages. Such a demand leads to a situation where the wiring patterns are arranged in closer proximity. As a result, a problem such as a crosstalk noise generated between the wirings or a fluctuation in the potential of a power source line or the like may occur. In particular, in a package on which an electronic component such as a semiconductor element requiring a high speed switching operation (such as an MPU) is mounted, an increase in frequency makes a crosstalk noise easy to be generated. In addition, a high speed on/off operation of a switching element generates a switching noise, which causes the potential of the power source line or the like to easily fluctuate. In this respect, for the purpose of stabilizing the power source voltage and reducing the switching noise or the like, an approach has been conducted in which a capacitor function is implemented in the semiconductor package and thus "decoupling" of the power source line or the like is performed.

As an example of the approach, the following structure with POP bonding is cited. In this structure, a chip capacitor is mounted on a back surface of a wiring board (the surface thereof on a side facing the other wiring board (package)), and the chip capacitor is then connected to the other package, thereby making an electrical connection between the wiring board and the other package. As a typical structure of the chip capacitor used in the aforementioned structure, the chip capacitor includes a substantially cuboid-shaped capacitor body (element portion) and a pair of terminal electrodes formed at both end portions of the capacitor body. Furthermore, a metal layer (typically, tin (Sn) plated layer) for enhancing the wettability of solder is provided on the uppermost surface of each of the terminal electrodes, the solder being used as a bonding member when the chip capacitor is mounted on a wiring board or the like.

Where the aforementioned mounting structure is implemented using such a chip capacitor, an appropriate amount of solder (paste-like) is first attached to each of the pads exposed from a solder resist layer on the back surface of the wiring board. Then, terminal electrodes of the capacitor are aligned with the positions of the pads, respectively. Thereafter, the terminal electrodes are bonded to the pads by melting the solder through reflow soldering. Thus the chip capacitor is mounted on the wiring board. Furthermore, required terminals (pads) are also prepared on the other package on which the wiring board is to be stacked. Then, an appropriate amount of solder (paste-like) is attached to the corresponding pads. Subsequently, the terminal electrodes of the capacitor are aligned with the positions of the pads, respectively. Thereafter, the chip capacitor is bonded to the other package by melting the solder through reflow soldering.

An example of the technique related to the aforementioned prior art is described in Japanese unexamined Patent Publication (JPP) (Kokai) 2000-77257. This publication discloses an axial type electronic component in which bottomed cylindrical-shaped metal caps are put over terminals of a chip-shaped electronic component element, respectively, and coated by resin. In this electronic component, a redundant metal layer made of solder is provided on the inner circumferential surface of the cylindrical portion of each of the metal caps. With this structure, the solder of the redundant metal layer flows outside the cylindrical portion when the resin expands. Thereby, a plated layer of each of the terminals is prevented from being affected by the expansion of the resin.

In addition, another technique related to the aforementioned prior art is described in JPP (Kokai) 2007-134398. This publication discloses a chip-shaped electronic component provided with terminal electrodes at both end portions of an element body, respectively. In this electronic component, a recessed portion is provided at a substantially center portion of the end surface of each of the terminal electrodes, and the width and the maximum depth of the recessed portion to be formed are selected to be predetermined values, respectively. With this structure, the occurrence of chip-standing is suppressed while the occurrence of solder spattering at the time of mounting of the electronic component is avoided.

In the prior art as described above, there is a case where the chip capacitor surface-mounted on the wiring board (package) is also connected to the other package and thus an electrical connection is made between both the packages. In that case, a problem below occurs due to the fact that the Sn plated layers are provided on the surfaces of the terminal electrodes of the chip capacitor.

Namely, when the chip capacitor is mounted on a wiring board (package), tin (Sn) contained in the plated layer on the surface of each of the terminal electrodes flows to the wiring board side due to the heat during reflow soldering, so that the amount of Sn in the portion on the opposite side (the other package side) of the terminal electrode is relatively reduced. In some cases, the metal portion of a layer (nickel (Ni) layer or another alloy layer, for example) below the Sn plated layer is exposed in the reduced portion, so that the solder wettability of the portion is reduced.

Accordingly, there occurs a problem in that, when the chip capacitor is bonded to solder prepared on the other package side, the solder on the other package and the plated portion of the chip capacitor do not wet sufficiently, so that the chip capacitor cannot be bonded to the solder. This is because the solder wettability of the portion on the other package side of the terminal electrodes is reduced as described above.

Namely, the terminal electrodes of the chip capacitor are provided in the form of being shared by the wiring board (package) side and the packaging board (other package) side. Accordingly, there occurs a problem in that, when a chip capacitor surface-mounted on a wiring board is bonded to a packaging board side, the chip capacitor is not sufficiently bonded to the packaging board and thus a closely-bonded state cannot be secured (poor connection) because of the insufficient wettability of the plated surface of the chip capacitor as described above.

SUMMARY OF THE INVENTION

An object of the present invention is to provide a chip component mounted wiring board which enables a surface-mounted chip component to be surely bonded to a packaging board when the chip component is bonded to the packaging board.

According to the invention, there is provided a chip component mounted wiring board to be used with being mounted on a packaging board, the chip component mounted wiring board including: a wiring board; and a chip component surface-mounted on a surface of the wiring board, the surface facing the packaging board, wherein the chip component includes terminal electrodes formed at both end portions of a component body thereof, respectively, and each of the terminal electrodes is provided in a form in which a plated film formed on a surface of the terminal electrode is separated into two portions, one portion being on the wiring board side, and another portion being on the packaging board side.

In addition, in the chip component mounted wiring board, the plated film formed on the surface of each of the terminal electrodes of the chip component is preferably formed of a metal layer having excellent solder wettability.

With the configuration of the chip component mounted wiring board according to the present invention, each of the plated films formed on the surfaces of the terminal electrodes of the chip component is provided in a form of being separated into two portions on the wiring board and packaging board sides, respectively. Thus, a plating material (for example, Sn) contained in the plated film on a portion of the packaging board side does not flow onto a corresponding one of the terminal electrodes on the wiring board side although the plating material melts due to the heat at the time of mounting the chip component on the wiring board and thus flows. Namely, the amount of plating material (for example, Sn) originally provided in the portion on the terminal electrode on the packaging board side can be left as it is.

Thereby, the wettability of the plated surface of the portion on the terminal electrode is sufficiently secured, so that when the chip component is bonded to the packaging board side, the chip component can be surely bonded thereto without causing a poor connection such as encountered in the prior art.

BRIEF DESCRIPTION OF THE DRAWINGS

FIG. 3A is a perspective view showing the appearance of the chip capacitor, and FIG. 3B is a vertical cross-sectional view when viewed along the ling A-A of FIG. 3A;

FIG. 8A is a perspective view showing the appearance of the chip capacitor, and FIG. 8B is a vertical cross-sectional view when viewed along the ling A-A of FIG. 8A.

With reference to the accompanying drawings, descriptions are given, using embodiments of the present invention to be described hereinafter, of other constructional features and advantages and the like based thereon of the chip component mounted wiring board according to the present invention.

DESCRIPTION OF THE PREFERRED EMBODIMENTS

Hereinafter, descriptions are given of preferred embodiments of the present invention with reference to the accompanying drawings.

First Embodiment

See FIGS. 1 to 5C

Figure 1:
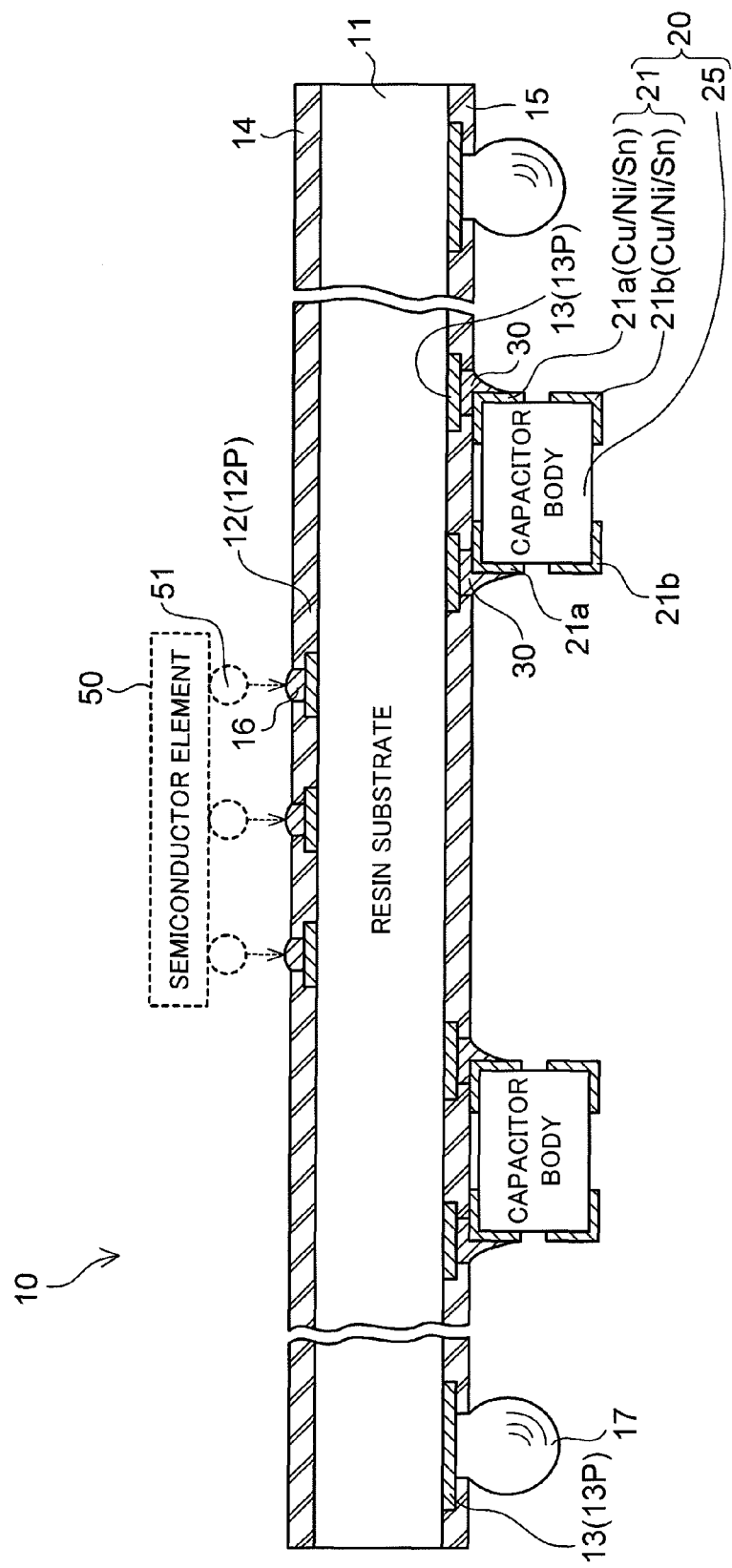
FIG. 1 is a cross-sectional view showing a configuration of a chip component mounted wiring board (package) according to a first embodiment of the present invention.
Figure 2:
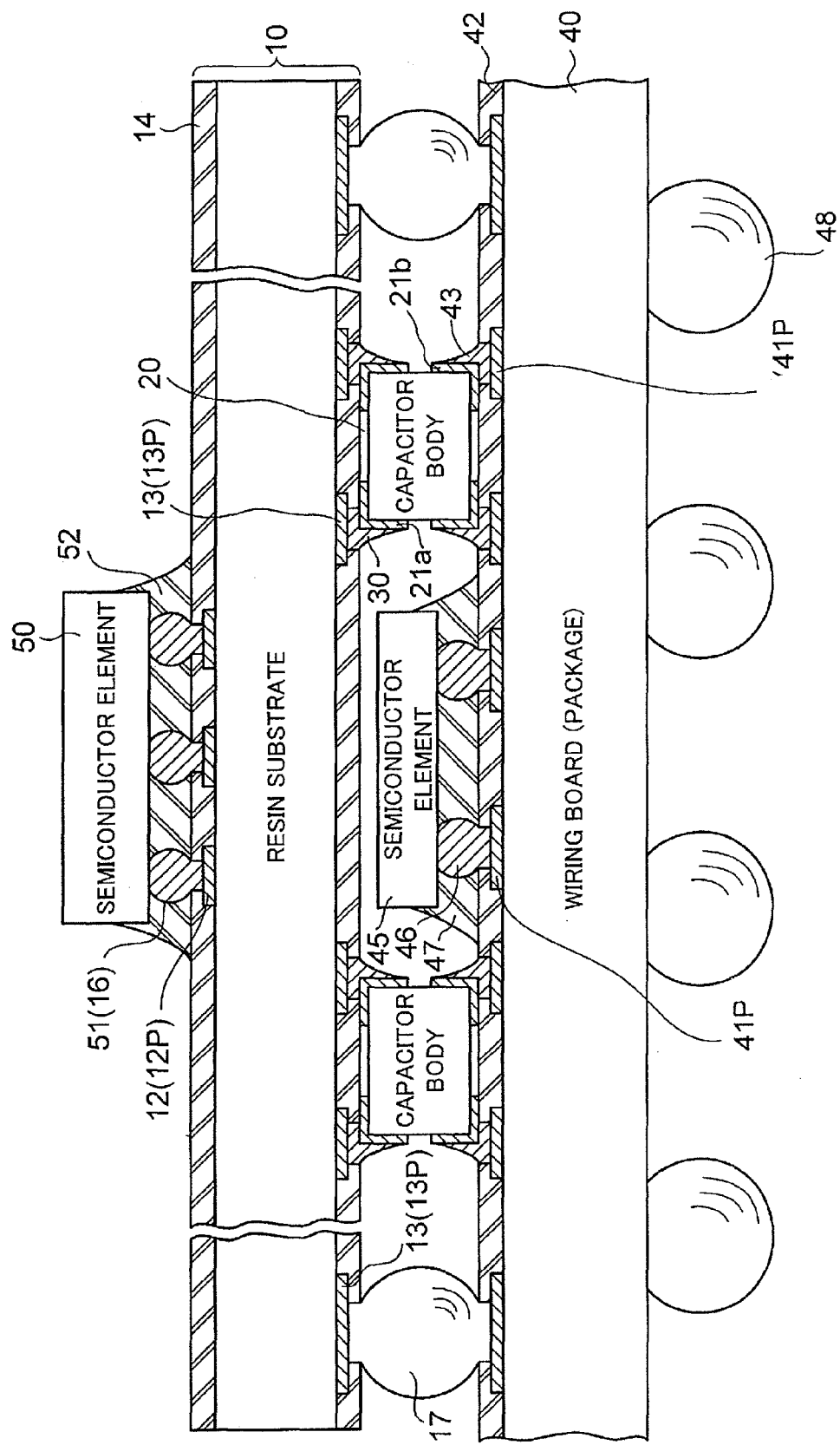
FIG. 2 is a cross-sectional view showing the state where the wiring board (package) of FIG. 1 is mounted on the other wiring board (package) (mounting structure of POP bonding)
Figure 3A:
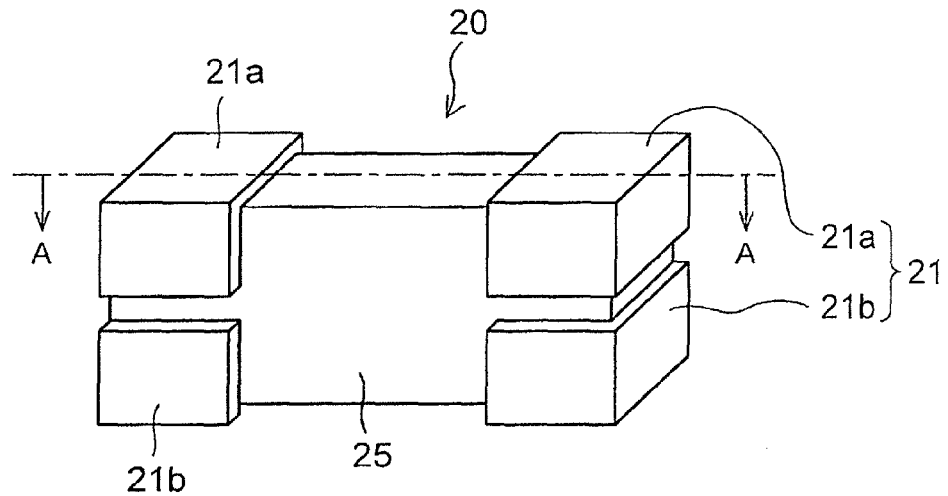
FIGS. 3A and 3B show a configuration of a chip component (chip capacitor) mounted on the wiring board of FIG. 1.
Figure 3B:
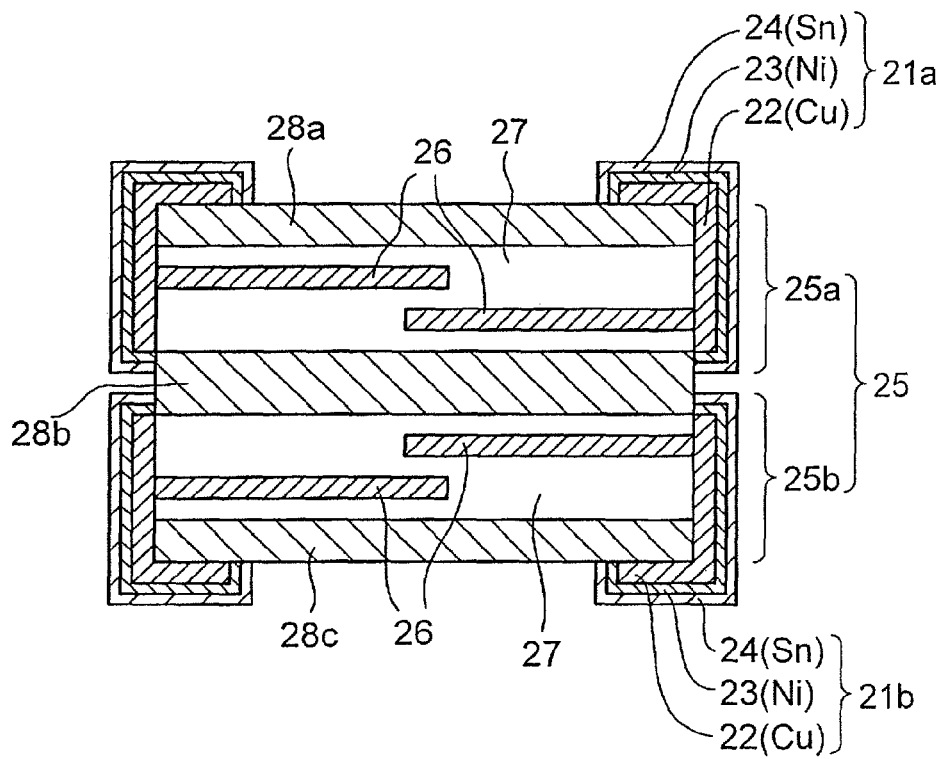

FIG. 1 shows a configuration of a chip component mounted wiring board (package) 10 according to a first embodiment of the present invention in cross-sectional view. FIG. 2 shows the state where the wiring board (package) 10 is mounted on the other wiring board (package 40) (mounting structure of POP bonding) in cross-sectional view. Moreover, FIGS. 3A and 3B show a configuration of a chip component (chip capacitor 20) surface-mounted on the package (wiring board 10). FIG. 3A shows the appearance (perspective view) of the chip capacitor 20, and FIG. 3B shows a vertical cross-sectional structure when viewed along the line A-A of FIG. 3A.

As shown in FIG. 1, in the chip component mounted wiring board (package) 10 of the present embodiment, reference numeral 11 denotes a resin substrate forming the body of the wiring board, and reference numerals 12 and 13 denote wiring layers patterned and formed in required shapes on both surfaces of the resin substrate 11, respectively. Moreover, reference numerals 14 and denote insulating layers (solder resist layers) serving as protection films formed to cover both the surfaces while exposing the portions of pads 12P and 13P defined at predetermined positions of the wiring layers 12 and 13, respectively.

As one form of the resin substrate 11, a substrate in which wiring layers are formed at least on the uppermost surface layers thereof, respectively, and the wiring layers are electrically connected to each other through the inside of the substrate is sufficient. Wirings may be or may not be formed inside the resin substrate 11. In the case where wiring layers are formed inside the resin substrate 11, the wiring layers formed on the respective uppermost surface layers are electrically connected to each other through via holes (vias: conductors filled in the via holes) mutually connecting the wiring layers stacked one on top of another inside the substrate with an insulating layer interposed therebetween. A detailed illustration thereof is omitted herein because it is not the gist characterizing the invention. As one substrate of this form, there is a wiring board formed of a multi-layer structure, for example, which can be formed using build-up process. On the other hand, in the case where the wirings are not formed inside the resin substrate 11, the wiring layers on the respective uppermost surface layers are electrically connected to each other via through holes (conductors filled into the through holes) appropriately formed at required positions of the resin substrate 11, respectively.

As shown by a broken line in FIG. 1, a semiconductor element (chip) 50 is to be mounted via electrode terminals 51 to one (top side in the illustrated example) of the surfaces of the package (wiring board 10) of the present embodiment. In view of this, taking the customer's convenience into consideration, solder 16 is attached, in advance by pre-soldering or the like, to the pads 12P so as to facilitate bonding to the electrode terminals 51 (gold (Au) bumps, solder bumps or the like) at the time of mounting of the semiconductor element 50, the pads 12P being on the side where semiconductor element 50 is mounted. Tin (Sn)-lead (Pb) based eutectic solder (composition: Sn: 62% and Pb: 38% with a melting point of approximately 183° C.), environment-friendly lead free solder (for example, Sn/silver (Ag)/copper (Cu) with a melting point of approximately 220° C.) or the like is used as the solder 16, for example.

Meanwhile, a chip component (chip capacitor 20) characterizing the present invention is mounted on the surface (bottom side in the illustrated example) opposite to the surface where the semiconductor element is mounted, i.e., the surface facing the other package 40 (FIG. 2). In the illustrated example, two chip capacitors 20 are surface-mounted. As shown in FIG. 3A, each of the chip capacitors 20 includes a substantially cuboid-shaped capacitor body 25 and a pair of terminal electrodes 21 formed at both the end portions of the capacitor body 25 in the longitudinal direction, respectively.

Each of the terminal electrodes 21 is separated into an upper portion (a pair of terminal electrodes 21a on the side to be mounted on the package 10) and a lower portion (a pair of terminal electrodes 21b on the side to be mounted on the other package 40). Specifically, each of the chip capacitors 20 is provided with the pairs of terminal electrodes 21a and 21b assigned for the package 10 and the other package 40, respectively.

Each of the vertical separated terminal electrodes 21a and 21b has a structure in which a copper (Cu) layer 22, a nickel (Ni) layer 23 and a tin (Sn) layer are stacked in the order from the lower surface. Among these layers, the Ni layer 23 and the Sn layer 24 are plated films formed by a plating method to be described later. Specifically, the Sn plated films 24 are formed on the uppermost surfaces of the terminal electrodes 21a and 21b, thereby, bonding the chip capacitor 20 to the wiring board 10, and moreover, allowing the wettability of solder to be sufficiently secured, the solder used as the bonding material at the time of bonding the chip capacitor 20 to the other package 40.

As shown in FIG. 3B, the capacitor body 25 forms an element portion of the chip capacitor 20 and is separated into two portions including an upper portion (capacitor portion 25a) and a lower portion (capacitor portion 25b). Each of the capacitor portions 25a and 25b includes a structure in which a pair of conductors each forming a capacitor electrode is arranged facing each other with a ceramic member 27 interposed therebetween. Further, the pair of conductors 26 in the capacitor portion 25a is covered by insulating layers 28a and 28b, and the pair of conductors 26 in the capacitor portion 25b is covered by insulating layers 28b and 28c, the insulating layers formed of a material having a high dielectric constant.

The pair of conductors (capacitor electrodes) 26 of the capacitor portion 25a is connected to a pair of terminal electrodes 21a (Cu layers 22 positioned innermost) positioned on corresponding sides, respectively. Moreover, the pair of conductors (capacitor electrodes) 26 of the capacitor portion 25b is connected to a pair of terminal electrodes 21b (Cu layers 22 positioned innermost) positioned on corresponding sides, respectively. In addition, the portions of both of end surfaces of the insulating layer 28b interposed between the capacitor portions 25a and 25b are partially exposed. Specifically, each of the terminal electrodes 21 of the chip capacitor 20 is separated into the portion on the package 10 side (terminal electrode 21a) and the portion on the other package 40 side (terminal electrode 21b) with a corresponding one of the exposed portions of the insulating layer 28b as a boundary.

Note that, the capacitor bodies 25 are not fabricated individually for the individual chip capacitors 20. Instead, as described later, the capacitor bodies 25 are fabricated by cutting and dividing a capacitor structure with a predetermined size, the capacitor structure formed in a sheet-like shape.

As shown in FIG. 1, each of the chip capacitors 20, which has the aforementioned structure, is mounted on the wiring board (package) 10 by bonding the pair of terminal electrodes 21a provided on one of the surfaces thereof to the pads 13P on the wiring board 10 via solder 30 attached to the corresponding pads 13P on the wiring board 10, respectively. Moreover, as shown in FIG. 2, each of the chip capacitors 20 mounted on the package 10 is mounted on the other package 40 by connecting the pair of terminal electrodes 21b provided on the other one of the surfaces thereof to pads 41P via solder 43 attached to the corresponding pads 41P (portions each defined at a required position and exposed through an opening of a solder resist layer 42) on the other wiring board (package) 40.

Furthermore, as shown in FIGS. 1 and 2, external connection terminals (solder balls 17 in the illustrated example) used in mounting the package 10 to the other package 40 are bonded to the other pads 13P exposed from the surface of the package 10 where the chip capacitors 20 are mounted. In the illustrated example, the solder balls 17 are bonded to the pads 13P, but pins may be bonded to the pads 13P, instead of the solder balls 17. However, in a case where pins are used for bonding, socket terminals for inserting the pins are appropriately provided at positions corresponding to the pins on the other package 40.

In addition, as shown in FIG. 2, the semiconductor element (specifically, an active device chip such as a CPU) 50 is mounted on the surface of the package 10, which is opposite to the surface thereof where the chip capacitors 20 are mounted. Electrode pads (not shown) of the semiconductor element 50 are flip-chip bonded to the pads 12P on the package 10 via solder bumps 51 (solder 16). Further, underfill resin 52 (thermosetting epoxy-base resin or the like) is filled into a gap between the mounted semiconductor element 50 and the package 10 and is then thermally cured, thereby, fixing the semiconductor element 50 to the package 10.

Moreover, in the same manner as the package 10, a semiconductor element (active device chip) 45 is mounted on the surface of the other package 40 where the chip capacitors 20 are mounted. Electrode pads (not shown) of the semiconductor element 45 are flip-chip bonded to the corresponding pads 41P on the package 40 via solder bumps 46, respectively. Further, underfill resin 47 is filled into a gap between the mounted semiconductor element 45 and the package 40 and is then thermally cured, thereby, fixing the semiconductor element 45 to the package 40.

Moreover, pads (not shown) are provided on a surface of the other package 40, which is opposite to the surface where the chip capacitors 20 are mounted. Then, solder balls 48 serving as external connection terminals are bonded to these pads by reflow soldering. In this case as well, instead of the solder balls 48, pins may be bonded to the pads.

Next, the description is given of a method of manufacturing the chip component mounted wiring board (semiconductor package) 10 of the present embodiment.

First, a wiring board (a portion of the structure excluding the chip capacitors 20 and the solder 30 from the configuration of the wiring board 10 of FIG. 1) in a stage prior to the mounting of the chip capacitors 20 is prepared. Specifically, fabricated is a wiring board having the wiring layers 12 and 13 patterned and formed in required shapes on both the surfaces of the resin substrate 11 forming the body of the wiring board, respectively. Moreover, the wiring board also includes the solder resist layers 14 and 15 formed so as to cover both the surfaces while exposing the portions of the pads 12P and 13P defined at required positions of the wiring layers 12 and 13, respectively. Furthermore, in the wiring board, the solder 16 is attached to the pads 12P on the side where the semiconductor element 50 is mounted, and the solder balls 17 are bonded to the pads 13P on the side, which is opposite to the aforementioned side.

As a form of the resin substrate 11, a substrate in which wiring layers are formed at least on the uppermost surface layers thereof, respectively, and the wiring layers are electrically connected to each other through the inside of the substrate is sufficient as described above. For example, a wiring board having a multi-layer structure formed by using build-up process can be used. The wiring board having a multi-layer structure is obtained by repeating, in turn, the formation of an insulating layer, the formation of a via hole in the insulating layer, and the formation of a wiring pattern (wiring layer) on the insulating layer and also in the via hole, on both surfaces of a core substrate serving as a base member. An epoxy base-resin is used as the material for the insulating layer, and copper (Cu) is used as the material for the wiring layer. The uppermost wiring layers 12 and 13 formed through the aforementioned process are electrically connected to each other through the vias connecting the wiring layers appropriately formed at required positions inside the substrate and between the wiring layers.

Ni plating and Au plating are preferably given to the pads (Cu) 12P and 13P in this order, the pads 12P and 13P defined at required positions of the uppermost wiring layers 12 and 13, respectively. The purposes of the plating is to increase contact characteristics (Au layer) when electrode terminals of a semiconductor element, or external connection terminals or the like for mounting of the other package are bonded to the pads 12P or 13P, and also to enhance adhesion between the Au layer and the Cu layer forming the pads as well as to prevent Cu from diffusing into the Au layer (Ni layer).

Furthermore, the solder resist layers 14 and 15 each serving as a protection film are formed on both the surfaces of the resin substrate 11, respectively. For example, a photosensitive epoxy base resin or the like is applied to the resin substrate 11 and the wiring layers 12 and 13, and then, the resin layers are formed in required shapes (shapes excluding the portions of the pads 12P and 13P of the wiring layers 12 and 13, respectively) by patterning, respectively. Thereby, the solder resist layers 14 and 15 can be formed. Moreover, the solder 16 is attached to the pads 12P by pre-soldering, the pads 12P being on the side where the semiconductor element 50 is mounted. Further, the solder balls 17 serving as external connection terminals are bonded to the pads 13P on the side opposite to the aforementioned side by reflow soldering.

The chip capacitors 20 characterizing the present invention are surface-mounted on the external connection terminal bonding surface of the wiring board fabricated in the manner described above.

Hereinafter, a description is given of a manufacturing method of the chip capacitors 20 with reference to FIGS. 4A through 5C, which show an example of the manufacturing method.

Figure 4A:
FIGS. 4A to 4D are cross-sectional views showing manufacturing steps of the chip capacitor of FIGS. 3A and 3B.
Figure 4B:
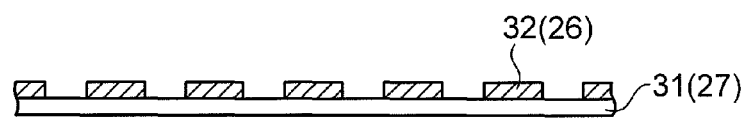
Figure 4C:
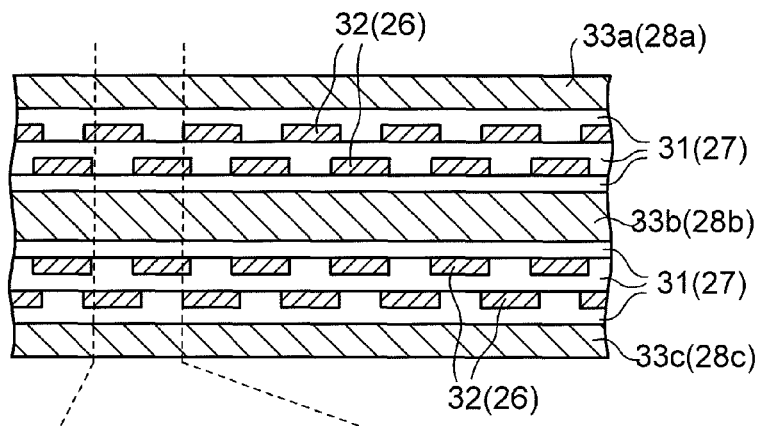
Figure 4D:
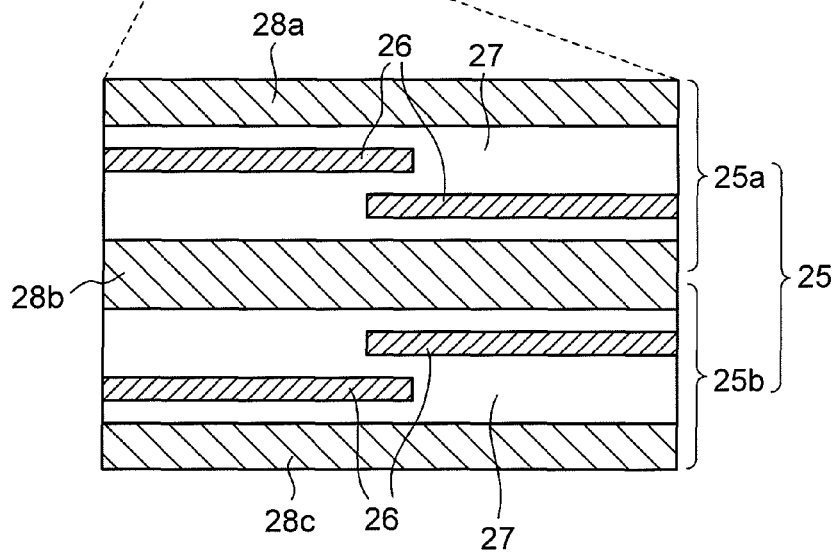
Figure 5A:
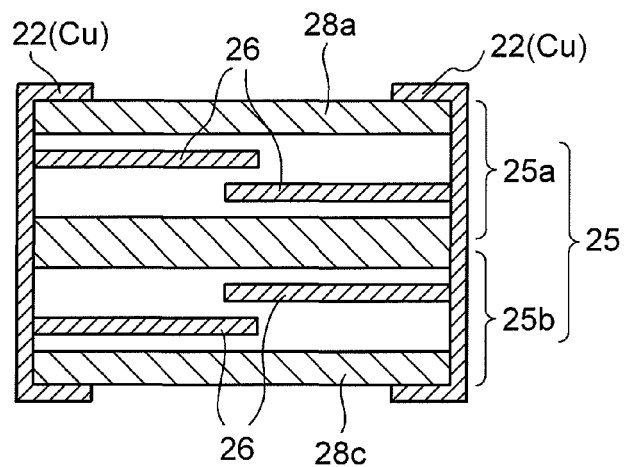
FIGS. 5A to 5C are cross-sectional views showing manufacturing steps subsequent to the manufacturing steps of FIGS. 4A and 4D.
Figure 5B:
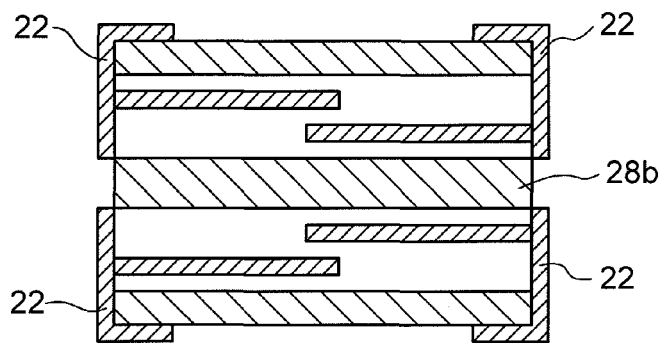
Figure 5C:
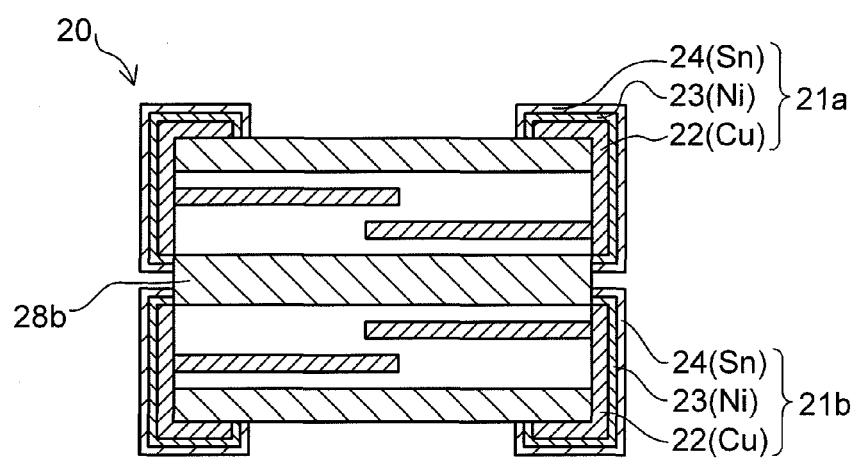

First, a ceramic sheet 31, which is a so-called green sheet, is prepared in the initial step (See FIG. 4A). The ceramic sheet 31 has adhesion properties and a thickness of approximately 5 μm. The ceramic sheet 31 corresponds to the ceramic member 27 shown in FIG. 3B.

In the next step (See FIG. 4B), conductors 32 (corresponding to the conductors 26 shown in FIG. 3B) each forming a capacitor electrode are attached in a required pattern on one of the surfaces of the ceramic sheet 31. For example, the conductors 32 can be formed on the sheet 31 by applying a copper (Cu) paste thereto by using a printing method or the like.

In the next step (See FIG. 4C), a required number of the ceramic sheets 31 each including the conductors 32 attached thereto are stacked one on top of another by using the adhesion properties thereof. The required number of the ceramic sheets 31 is the number of sheets corresponding to the thickness of each of the required capacitor portions 25a and 25b (See FIG. 3B). When the ceramic sheets 31 each including the conductors 32 attached thereto are stacked one on top of another, the ceramic sheets 31 are stacked so that the conductors 32 vertically adjacent to each other can partially face each other as illustrated. Two sets of the structure obtained by stacking the ceramic sheets 31 in the aforementioned manner are prepared. Then, insulating layers 33a, 33b and 33c (corresponding to the insulating layers 28a, 28b and 28c shown in FIG. 3B) are stacked so as to cover each of the structures. As the material of the insulating layers 33a, 33b and 33c, BTO (BaTiO$_3$: barium titanate) having a high dielectric constant is used.

Specifically, ceramic generally has a low dielectric constant, so that a sheet-shaped capacitor structure having a required dielectric constant is fabricated by interposing the insulating layers 33a, 33b and 33c formed of a material having a high dielectric constant.

In the next step (See FIG. 4D), the capacitor structure fabricated in the sheet-like shape is cut and divided into individual pieces with a required size of the required capacitor body 25. Furthermore, the capacitor body 25 after the division is burned (heating to a high temperature of 800 to 1600° C., for example) to enhance the mechanical strength thereof.

Through the aforementioned process, the following structure (capacitor body 25) is fabricated. The capacitor body 25 is separated into the two portions including the upper capacitor portion 25a and the lower capacitor portion 25b as illustrated. Moreover, the pair of conductors (capacitor electrodes) 26 is arranged partially facing each other with the ceramic member 27 interposed therebetween in each of the capacitor portions 25a and 25b. In addition, one edge of each of the conductors 26 is exposed from a corresponding one of end surfaces of the structure, and the pair of conductors 26 in the upper capacitor portion 25a is covered by the insulating layers 28a and 28b, and the lower capacitor portion 25b is covered by the insulating layers 28b and 28c, the insulating layers 28a, 28b and 28c formed of a material having a high dielectric constant.

In the next step (See FIG. 5A), copper (Cu) layers 22 each forming the lowermost conductive layer of the terminal electrode 21 (FIGS. 3A and 3B) are formed at both end portions of the capacitor body 25, respectively. The Cu layers 22 are formed on the end surface portions of the capacitor body 25 and extended to the vicinities of end portions of the insulating layers 28a and 28c positioned outward, respectively. For example, the Cu layers 22 can be formed by attaching a Cu paste to both the end portions of the capacitor body 25 by dipping (soaking method) or the like, for example, and then drying and burning the Cu paste. Thereby, each of the pair of conductors 26 in each of the capacitor portions 25a and 25b is connected to a corresponding one of the Cu layers 22.

In the next step (See FIG. 5B), a center portion (a belt-like portion along a direction in parallel with a surface orthogonal to the thickness direction of the capacitor body 25) of each of the Cu layers 22 formed on both the end portions of the capacitor body 25 is removed so as to partially expose a corresponding one of both the end surfaces of the insulating layer 28b interposed between the capacitor portions 25a and 25b. For example, mechanical grinding such as grinding or milling, or laser machining using a carbon dioxide laser, an excimer laser or the like can be used for removal of the portions of the Cu layers 22.

In the final step (See FIG. 5C), the Ni layer 23 is formed by Ni plating on each of the Cu layers 22 formed separately on the upper and lower portions of each of both the end portions of the capacitor body 25. Further, the Sn layer 24 is formed on the Ni layer 23 by Sn plating. Thereby, the following structure (chip capacitor 20) is fabricated. In the structure, the terminal electrodes 21a and 21b each formed of a three-layer structure of the conductor layers (Cu layer 22, Ni plated layer 23 and Sn plated layer 24) are formed, the conductive layers stacked one on top of another. Moreover, the terminal electrodes 21a and 21b are separated from each other by a corresponding one of the exposed portions of the insulating layer 28b as a boundary.

The chip capacitors 20 fabricated in the manner described above are surface-mounted at required positions of the external connection terminal bonding surface of the previously fabricated wiring board, respectively. Specifically, an appropriate amount of solder paste is applied to corresponding ones of the pads 13P on the wiring board; the corresponding pairs of terminal electrodes 21a of the respective chip capacitors 20 are aligned with the positions of the pads 13P, respectively; thereafter, the terminal electrodes 21a are bonded (soldered) to the pads 13P by melting the solder paste through reflow soldering. Thus, the chip component mounted wiring board 10 (FIG. 1) of the present embodiment is fabricated.

With this soldering, the solder 30 bonding the terminal electrode 21a with the pad 13P forms a good shaped fillet as shown in FIG. 1. Specifically, because of the presence of the Sn plated layer 24 formed on the surface of each of the terminal electrodes 21a, the solder wettability of the surface of the electrode can be sufficiently secured. Thus, the terminal electrodes 21a can be surely bonded to the pads 13P, respectively.

Meanwhile, the pair of terminal electrodes 21b on the side opposite to the wiring board 10 side is separated from the terminal electrodes 21a on the wiring board 10 side as illustrated. Thus, although the Sn in the Sn plated layer 24 formed on the surface of each of the terminal electrodes 21b melts once at the time of reflow soldering on the wiring board 10 side and flows, the Sn does not flow onto a corresponding one of the terminal electrodes 21a on the wiring board 10 side. In other words, the appropriate amount of Sn originally provided on the surface of the electrode 21b can be left unchanged.

As described above, with the configuration of the chip component mounted wiring board (package) 10 according to the present embodiment, each of the terminal electrodes 21 of each of the chip capacitors is separated into the upper portion (terminal electrode 21a on the side to be mounted on the package 10) and the lower portion (terminal electrode 21b on the side to be mounted on the other package 40). Accordingly, the Sn contained in the Sn plated layer 24 of the terminal electrode 21b on the other package 40 side melts due to the heat during reflow soldering when the chip capacitor 20 is mounted on the package 10 and then flows, but does not flow out onto the terminal electrode 21a on the package 10 side. In other words, the amount of Sn originally contained in the Sn plated layer 24 of the terminal electrode 21b on the other package 40 side can be left unchanged.

As a result, when the chip capacitors 20 are bonded to the other package 40, the wettabilities of the plated surfaces (Sn layers 24) of the terminal electrodes 21b on the other package 40 side are sufficiently secured. Accordingly, the chip capacitors can be securely bonded to the other package 40 without causing the poor connection observed in the prior art.

Moreover, as exemplified in FIG. 3B, the capacitor body 25 of each of the chip capacitors 20 has the configuration in which the capacitor portions 25a bonded to the pair of the terminal electrodes 21a on one side (package 10 side) and the capacitor portions 25b bonded to the pair of terminal electrodes 21b on the other side (package 40 side) are insulated from each other with the insulating layer 28b interposed therebetween. Thus, there is no electrical conduction between the package 10 and the package 40. With this configuration, the upper portion (capacitor portions 25a) and the lower portion (capacitor portions 25b) of the chip capacitor 20 can be dedicatedly used as the capacitors of the package 10 and the package 40, respectively.

In addition, even when only one chip capacitor 20 is provided, the chip capacitor can be used for both of the package 10 and the package 40 (in other words, other capacitors do not have to be provided for the package 10 and the package 40, respectively), thereby making it possible to contribute to a reduction of the capacitor mounting space.

Furthermore, since there is no electrical conduction between the package (wiring board 10) and the other package 40, the chip capacitor 20 mounted on the package 10 can be used for mechanically connecting to the other package 40.

Note that, in this embodiment, the configuration in which the capacitor portions 25a and 25b forming the capacitor body 25 are insulated from each other is adapted, but the portions do not have to be necessarily insulated from each other, and a configuration in which an electrical conduction is made between the wiring board 10 and the other package 40 may be adapted.

Second Embodiment

See FIGS. 6 to 9

Figure 6:
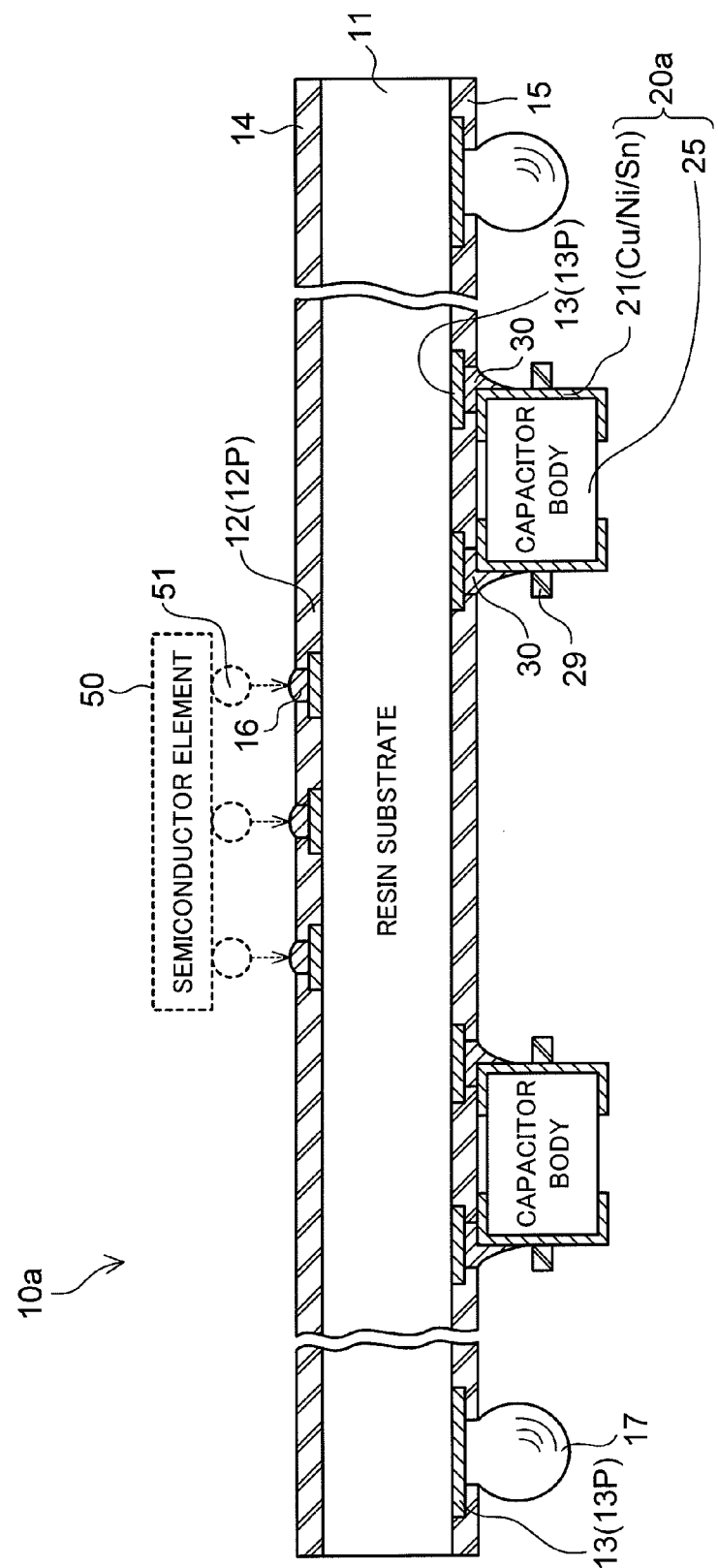
FIG. 6 is a cross-sectional view showing a configuration of a chip component mounted wiring board (package) according to a second embodiment of the present invention.
Figure 7:
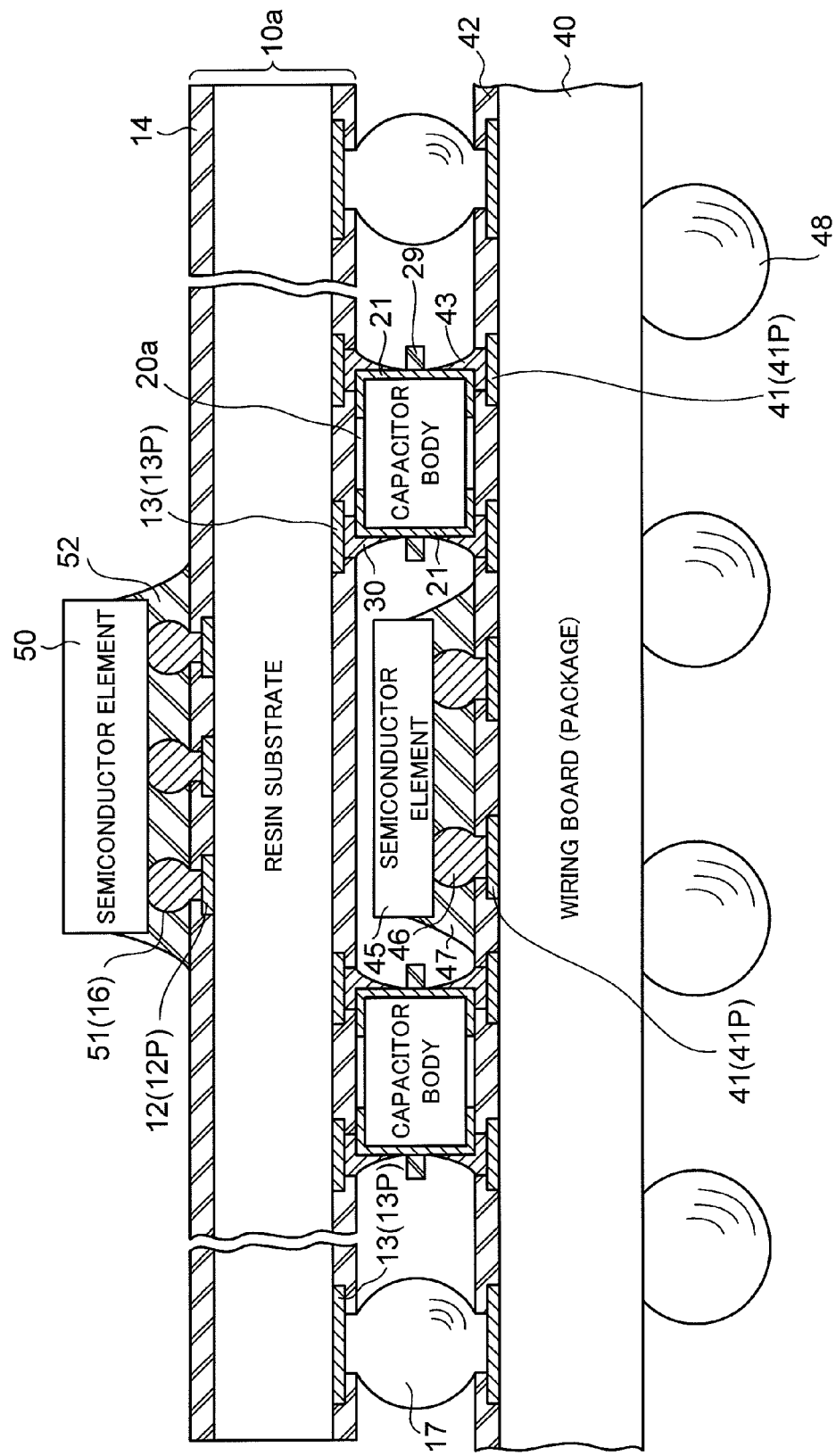
FIG. 7 is a cross-sectional view showing the state where the wiring board (package) of FIG. 6 is mounted on the other wiring board (package) (mounting structure of POP bonding)
Figure 8A:
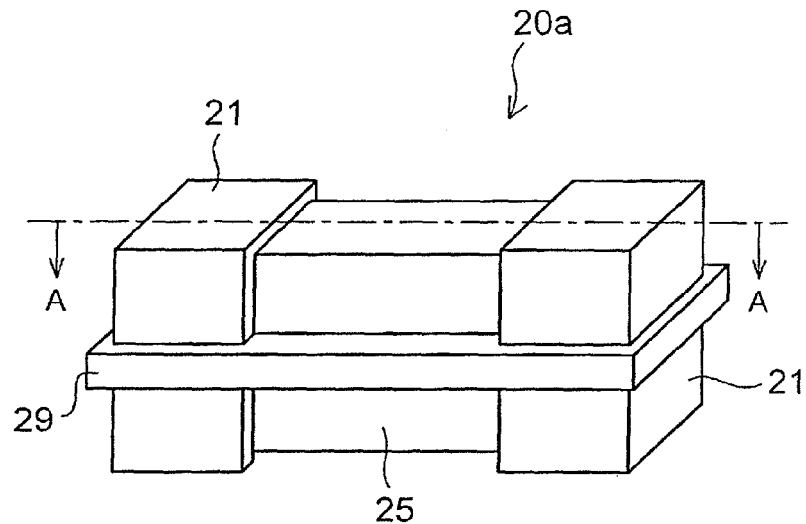
FIGS. 8A and 8B show a configuration of a chip component (chip capacitor) mounted on the wiring board of FIG. 6.
Figure 8B:
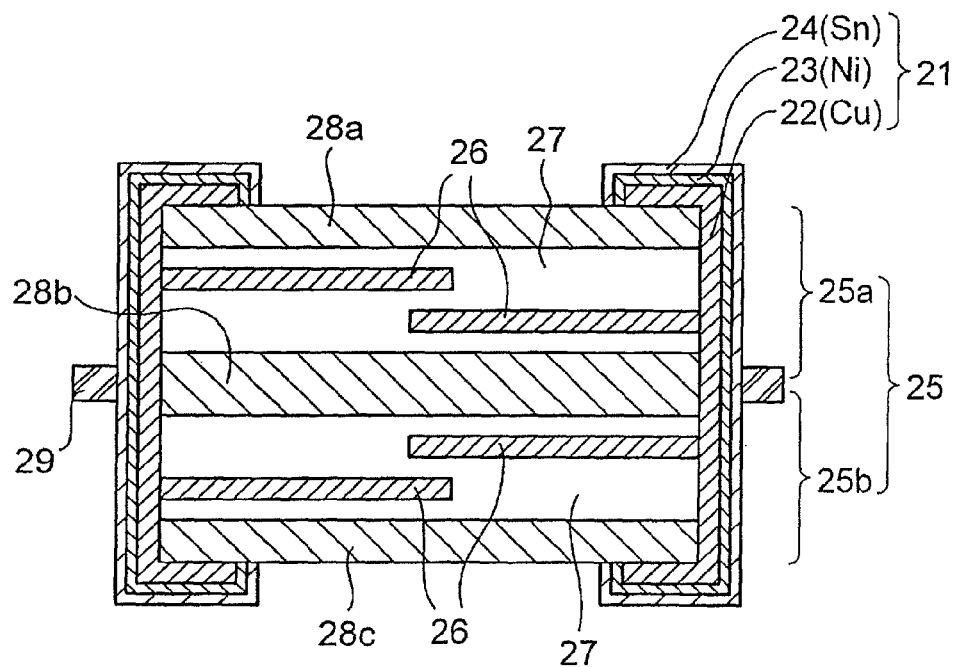

FIG. 6 shows a configuration of a chip component mounted wiring board (package) 10a according to a second embodiment of the present invention in cross-sectional view. FIG. 7 shows the state where the wiring board (package) 10a is mounted on the other wiring board (package) 40) (mounting structure of POP bonding) in cross-sectional view. Moreover, FIGS. 8A and 8B show a configuration of a chip component (chip capacitor 20a) surface-mounted on the package (wiring board 10a). FIG. 8A shows the appearance (perspective view) of the chip capacitor 20a, and FIG. 8B shows a vertical cross-sectional structure when viewed along the line A-A of FIG. 8A.

The configuration of the chip component mounted wiring board (package) 10a according to the second embodiment (FIGS. 6 to 9) is different from that of the chip component mounted wiring board (package) 10 according to the first embodiment (FIGS. 1 to 3B) in the following points. Instead of vertically separating the terminal electrodes 21 of the chip capacitor 20a, an insulator (insulating resin layer 29) is provided at a position to separate the package (wiring board 10a) side and the other package 40 side from each other. Moreover, the insulator is provided in a belt-like shape in a protruding manner so as to surround the circumferences of the chip capacitor body 25 and the terminal electrodes 21 at both the end portions thereof. Since the other parts of the configuration of the chip component mounted wiring board (package) 10a according to the second embodiment are the same as those in the first embodiment, detailed descriptions thereof are omitted herein.

In the present embodiment, the belt-like insulating resin layer 29 provided at the position to separate the package 10a side and the other package 40 side from each other functions as a dam which prevents tin (Sn) from flowing from one side on the plated film (Sn plated layer 24) of the terminal electrode 21 to the other side thereof. With this configuration, the same advantageous effects as those of the aforementioned first embodiment can be achieved.

Namely, the Sn contained in the portion of the Sn plated layer 24 on the terminal electrode 21 on the other package 40 side melts due to the heat during reflow soldering at the time of mounting the chip capacitor 20a to the package 10a and then flows, but does not flow out on the package 10a side because the Sn is prevented from flowing out by the dam (insulating resin layer 29). In other words, the amount of Sn originally contained in the portion on the terminal electrode 21 on the other package 40 side can be left as it is. Accordingly, the wettability of the plated surface (Sn plated layer 24) of the portion on the other package 40 side can be sufficiently secured when the chip capacitor 20a is bonded to the other package side. Thus the chip capacitor 20a can be surely bonded to the other package 40.

In the present embodiment, the insulator (insulating resin layer 29) is provided in a belt-like shape in a protruding manner so as to surround the circumferences of the capacitor body 25 of the chip capacitor 20a and the terminal electrodes 21 at both the end portions thereof as shown in FIG. 8A. However, as long as the aforementioned insulator is provided at least on each of the terminal electrodes 21, the effect of the present invention can be sufficiently achieved. In other words, the aforementioned insulator does not have to be necessarily provided at the circumference portion of the capacitor body 25.

Figure 9:
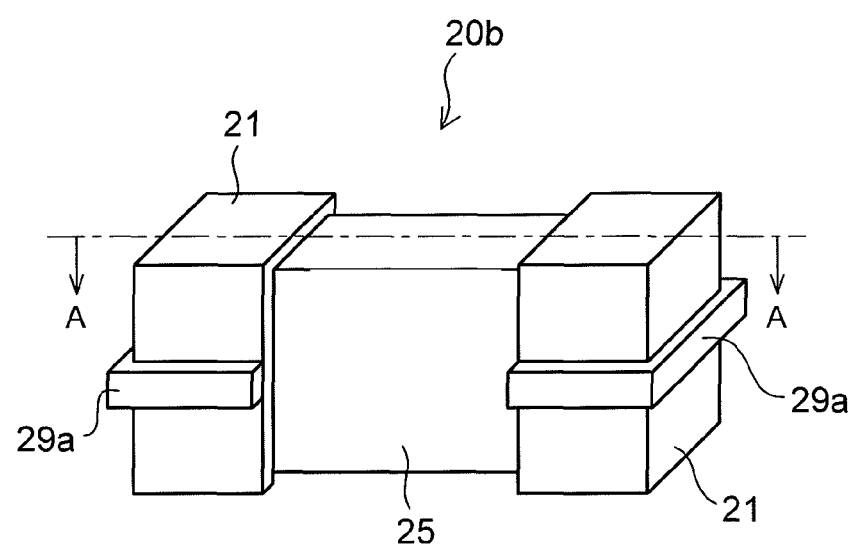
FIG. 9 is a perspective view showing the appearance of a chip capacitor according to a modification of the embodiment of FIGS. 8A and 8B.

FIG. 9 shows the appearance (perspective view) of a chip capacitor 20b according to an embodiment of the aforementioned case (modification of FIG. 8A). As illustrated, insulators (insulating resin layers 29a) are provided in a belt-like shape in a protruding manner only on the terminal electrodes 21, respectively. Note that, a cross-sectional structure as viewed along the line A-A in FIG. 9 is basically the same as that shown in FIG. 8B.

In each of the aforementioned embodiments, the description is given of an example of the case where BTO ($BaTiO_3$: barium titanate) is used as the material forming the dielectric layer (insulating layers 28a, 28b and 28c) of the chip capacitor 20 (20a and 20b). However, the material is not limited to the aforementioned one as a matter of course. Basically, a material having a dielectric constant as high as possible is sufficient. Other than BTO, for example, a metal oxide such as BST ($BaSrTiO_3$: barium strontium titanate), PZT (Pb-$TiO_3$—$PbZrO_3$: lead zirconate titanate), STO ($SrTiO_3$: strontium titanate), TiOx (titanium oxide), or resin or the like containing a filler of the aforementioned metal oxide can be used.

In addition, in each of the aforementioned embodiments, the description is given of an example of the case where the chip capacitor 20 (20a, 20b) is mounted on the surface of the package 10 (10a) as a chip component, the surface facing the other package 40.

However, as is apparent from the gist of the invention (to separate the portion of the plated film formed on the surface of each of the terminal electrodes of a chip component into the package (wiring board) side and the other package (packaging board) side), the chip component to be mounted is not limited to a capacitor as a matter of course. Basically, a chip component having the following structure is sufficient. First, terminal electrodes are provided at both end portions of the element body, respectively, in the structure. Moreover, metal layers each having excellent solder wettability (typically, Sn layer) are formed on the surfaces of the terminal electrodes, respectively, in the structure. As long as the chip component has the structures, the present invention can be also applied to a case where a chip component such as an inductor or resistant element is mounted.

Moreover, in each of the aforementioned embodiments, the description is given of an example of the case where the resin substrate 11 is used as a form of the wiring board body. However, the form of the wiring board body is not limited to the resin substrate. For example, a silicon substrate as used in a wafer level package can be used. Where the silicon substrate is used, aluminum (Al) electrode pads are provided on the silicon (Si) substrate, and passivation films formed of $SiO_2$, SiN, a polyimide resin or the like are provided instead of the aforementioned solder resist layers 14 and 15. Alternatively, a ceramic substrate can be used as another form of the wiring board body.

What is claimed is:

1. A chip component mounted wiring board comprising:
   a body of the wiring board having a semiconductor element mounting surface and an opposite surface to the semiconductor element mounting surface via the body of the wiring board;
   insulating films covering the semiconductor element mounting surface and the opposite surface, respectively;
   a plurality of pads exposed through openings formed in the insulating films on the semiconductor element mounting surface and the opposite surface, respectively, the plurality of pads including
      first pads formed on the semiconductor element mounting surface, and
      second pads formed on the opposite surface; and
   a chip component surface-mounted on the opposite surface, the chip component including
   a component body, and
   a pair of terminal electrodes which are provided at both end portions of the component body, and on respective surfaces of which plated films are formed, wherein the component body is separated into a first element portion and a second element portion between which an insulating layer is interposed, the insulating layer includes exposed portions at both end portions of the insulating layer, and each of the pair of the terminal electrodes is separated via each of the exposed portions at the both end portions of the insulating layer into the first terminal electrode which is electrically connected to the first element portion and the second terminal electrode which is electrically connected to the second element portion, wherein the first terminal electrode of the chip component is electrically connected to the second pads on the opposite surface of the body of the wiring board.

2. The chip component mounted wiring board according to claim 1, wherein the plated film is formed of a metal layer having excellent solder wettability.

3. The chip component mounted wiring board according to claim 1, wherein the component body of the chip component has a structure in which the first element portion and the second element portion are insulated from each other.

4. A chip component mounted wiring board comprising:

a body of the wiring board having a semiconductor element mounting surface and an opposite surface to the semiconductor element mounting surface via the body of the wiring board;

insulating films covering the semiconductor element mounting surface and the opposite surface, respectively;

a plurality of pads exposed through openings formed in the insulating films on the semiconductor element mounting surface and the opposite surface, respectively, the plurality of the pads including first pads formed on the semiconductor element mounting surface, and second pads formed on the opposite surface; and a chip component surface-mounted on the opposite surface, the chip component including a component body, and a pair of terminal electrodes which are provided at both end portions of the component body, respectively, and on respective surfaces of which plated films are formed, respectively; and a belt-shaped insulator provided in a protruding manner at least on each of the pair of the terminal electrodes, wherein the component body is separated into a first element portion and a second element portion between which an insulating layer is interposed therebetween, each of the pair of the terminal electrodes is formed across each of the both end portions of the component body, and makes an electrical connection between the first element portion and the second element portion, and the insulator is provided at a position to divide each of the plated films into two portions of the wiring board side and the other wiring board side.

5. The chip component mounted wiring board according to claim 2, wherein the plated film is formed of a tin (Sn) layer.

* * * * *

UNITED STATES PATENT AND TRADEMARK OFFICE
CERTIFICATE OF CORRECTION

PATENT NO.        : 8,331,101 B2
APPLICATION NO.   : 12/693530
DATED             : December 11, 2012
INVENTOR(S)       : Toshiaki Aoki et al.

Page 1 of 1

It is certified that error appears in the above-identified patent and that said Letters Patent is hereby corrected as shown below:

On the Title page

Item (73) Assignee should read: Shinko Electric Industries Co., Ltd.

Signed and Sealed this
Twelfth Day of March, 2013

Teresa Stanek Rea
*Acting Director of the United States Patent and Trademark Office*